(12) United States Patent
Lee et al.

(10) Patent No.: US 11,672,156 B2
(45) Date of Patent: Jun. 6, 2023

(54) DISPLAY DEVICE

(71) Applicant: SAMSUNG DISPLAY CO., LTD., Yongin-si (KR)

(72) Inventors: Hyeonbum Lee, Hwaseong-si (KR); Jin-Whan Jung, Chungcheongnam-do (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 31 days.

(21) Appl. No.: 16/939,437

(22) Filed: Jul. 27, 2020

(65) Prior Publication Data
US 2021/0151512 A1    May 20, 2021

(30) Foreign Application Priority Data

Nov. 18, 2019    (KR) .................... 10-2019-0147657

(51) Int. Cl.
  *G06F 3/041*    (2006.01)
  *H01L 27/32*    (2006.01)
  *H01L 51/52*    (2006.01)

(52) U.S. Cl.
  CPC .......... *H01L 27/323* (2013.01); *G06F 3/0412* (2013.01); *H01L 27/3246* (2013.01); *H01L 51/5237* (2013.01); *H01L 51/5284* (2013.01); *H01L 51/5293* (2013.01)

(58) Field of Classification Search
  None
  See application file for complete search history.

(56) References Cited

U.S. PATENT DOCUMENTS

| 10,572,086 | B2  | 2/2020 | Na et al. |
| 2015/0185942 | A1* | 7/2015 | Kim ...................... G06F 3/0445 |
| | | | 345/173 |
| 2018/0123074 | A1 | 5/2018 | Lee et al. |
| 2019/0018530 | A1* | 1/2019 | Lee ..................... H01L 27/3244 |
| 2019/0252838 | A1 | 8/2019 | Lee |

FOREIGN PATENT DOCUMENTS

| KR | 1020180047560 | 5/2018 |
| KR | 1020190025096 | 3/2019 |
| KR | 1020190098298 | 8/2019 |

* cited by examiner

*Primary Examiner* — Brian M Butcher
(74) *Attorney, Agent, or Firm* — F. Chau & Associates, LLC (57) ABSTRACT

A display device includes a display element layer, a light blocking pattern layer disposed on the display element layer, and an input sensing layer disposed on the light blocking pattern layer. The display element layer includes a plurality of pixel defining films and a protrusion disposed on at least one pixel defining film, the light blocking pattern layer includes a light blocking part that overlaps the protrusion and an opening, the input sensing layer includes a plurality of sensing electrodes and a plurality of intersections where the sensing electrodes cross each other. The protrusion, the opening, and at least some of the plurality of intersections overlap each other.

18 Claims, 9 Drawing Sheets

DISPLAY DEVICE

CROSS-REFERENCE TO RELATED APPLICATIONS

This U.S. non-provisional patent application claims priority under 35 U.S.C. § 119 from, and the benefit of, Korean Patent Application No. 10-2019-0147657, filed on Nov. 18, 2019 in the Korean Intellectual Property Office, the contents of which are herein incorporated by reference in their entirety.

BACKGROUND

Embodiments of the present disclosure herein are directed to a display device, and more particularly, to a display device that includes a light blocking part disposed on a lower portion of an input sensing layer.

Various display devices used for multimedia devices such as television sets, mobile phones, tablet computers, navigation systems, game consoles, have been being developed. Input devices of display devices include keyboards, mouses or remote controls. In addition, a display device may include a touch panel as an input device.

Although a separate light blocking pattern layer has been introduced to improve the reflective color of a display device, research is being conducted to overcome differences in dielectric constants and touch sensitivities on a touch panel due to the introduction of a light blocking pattern layer.

SUMMARY

Embodiments of the present disclosure provide a display device in which a difference in dielectric constant in an input sensing layer due to a protrusion disposed on a pixel defining film is reduced.

Embodiments of present disclosure also provide a display device that has improved touch sensitivity by removing a part of a light blocking part of a light blocking pattern layer to reduce a difference in dielectric constant.

An embodiment of the inventive concept provides a display device that includes a display element layer, a light blocking pattern layer disposed on the display element layer, and an input sensing layer disposed on the light blocking pattern layer and that includes a plurality of sensing electrodes. The display element layer includes a plurality of pixel defining films spaced apart from each other, and a protrusion disposed on at least one of the plurality of pixel defining films. The light blocking pattern layer includes a plurality of light blocking parts that overlap the pixel defining films, and an opening formed in at least one of the plurality light blocking parts that overlap the protrusion. Each of the sensing electrodes includes a first pattern line that extends in a first direction, a second pattern line that extends in a second direction that crosses the first direction, and an intersection where the first pattern line and the second pattern line cross each other. The protrusion, the opening, and the intersection overlap.

In a cross-section parallel to a stacking direction of the display element layer and the light blocking pattern layer, a first width that is a maximum width of the pixel defining film may be equal to a second width of the opening.

In the cross section, a third width of the intersection may be less than the first width and the second width.

The light blocking pattern layer may be directly disposed on the display element layer, and the input sensing layer may be directly disposed on the light blocking pattern layer.

An exposure width of one side of a pixel defining film on which the protrusion is disposed and which does not overlap the protrusion may be about 7 μm to about 8 μm.

A ratio of a maximum height $H_2$ of the protrusion to a maximum height $H_1$ of the pixel defining film in a cross section parallel to a stacking direction of the display element layer and the light blocking pattern layer may satisfy a following expression: $0.3 \leq H_2/H_1 \leq 1$.

The intersection may include a first intersection that overlaps the protrusion, and a second intersection that overlaps the pixel defining film but not the protrusion.

The ratio of a shortest distance $D_1$ between the protrusion and the first intersection to a shortest distance $D_2$ between the pixel defining film and the second intersection may satisfy a following expression: $0.8 \leq D_1/D_2 \leq 1$.

Each of the sensing electrodes may include a plurality of the first intersections and a plurality of the second intersections disposed adjacent to each other in one direction, and two to four of the plurality of second intersections may be disposed between closest first intersections among the intersections.

The display device may further include a display area and a non-display area that surrounds the display area. On a plane, an area ratio of the protrusion with respect to a total area of the display area may be about 1% to about 2%.

The protrusion includes a lower surface adjacent to the pixel defining film and an upper surface that faces the lower surface, and in a plane parallel to the upper surface, the upper surface may have a polygonal shape that has one side length of about 10 μm to about 30 μm.

The display element layer may further include light emitting elements disposed between the pixel defining films. Each of the light emitting elements may include a first electrode and a second electrode that face each other, and a light emitting layer disposed between the first electrode and the second electrode.

The display device may further include a polarization layer disposed on the input sensing layer.

In an embodiment of the inventive concept, a display device includes a plurality of light emitting regions and non-light emitting regions adjacent to the light emitting regions, a display element layer that includes a plurality of pixel defining films that correspond to the non-light emitting regions and a protrusion disposed on at least one of the plurality of pixel defining films, a light blocking pattern layer disposed on the display element layer and that includes a plurality of light blocking parts that overlap the non-light emitting regions, and an input sensing layer disposed on the light blocking pattern layer and that includes a plurality of sensing electrodes. The light blocking pattern layer includes a first light blocking part that overlaps the protrusion and in which an opening is formed, and a second light blocking part that does not overlap the protrusion. Each of the sensing electrodes includes a first pattern line that extends in a first direction, a second pattern line that extends in a second direction that crosses the first direction, and an intersection where the first pattern line and the second pattern line cross each other. The protrusion, the opening, and the intersection overlap.

The display element layer includes a plurality of protrusions and two to four of the plurality of pixel defining films that do not overlap the protrusions may be disposed between two most adjacent protrusions.

Each of first light blocking part and the second light blocking part may overlap the pixel defining film.

The display device may further include an organic layer disposed on the light blocking pattern layer and that fills spaces between the light blocking parts and the opening in the first light blocking part.

An area ratio of the protrusion with respect to a total area of the plurality of light emitting regions may be about 1% to about 2%.

The display device may further include a circuit layer and a base substrate disposed on a lower portion of the display element layer.

In a cross section parallel to a stacking direction of the display element layer and the light blocking pattern layer, a first width that is a maximum width of the pixel defining film may be equal to a second width of the opening, and a third width of the intersection may be less than the first width and the second width.

DETAILED DESCRIPTION

The inventive concept may be modified in many alternate forms, and thus specific embodiments will be exemplified in the drawings and described in detail. It should be understood, however, that it is not intended to limit the inventive concept to the particular forms disclosed, but rather, is intended to cover all modifications, equivalents, and alternatives falling within the spirit and scope of the invention.

In the present disclosure, when an element, or region, layer, portion, etc., is referred to as being "on," "connected to," or "coupled to" another element, it means that the element may be directly disposed on/connected to/coupled to the other element, or that a third element may be disposed therebetween.

Like reference numerals may refer to like elements. Also, in the drawings, the thickness, the ratio, and the dimensions of elements may be exaggerated for an effective description of technical contents.

Hereinafter, a display device according to an embodiment of the inventive concept will be described with reference to the accompanying drawings.

Figure 1:
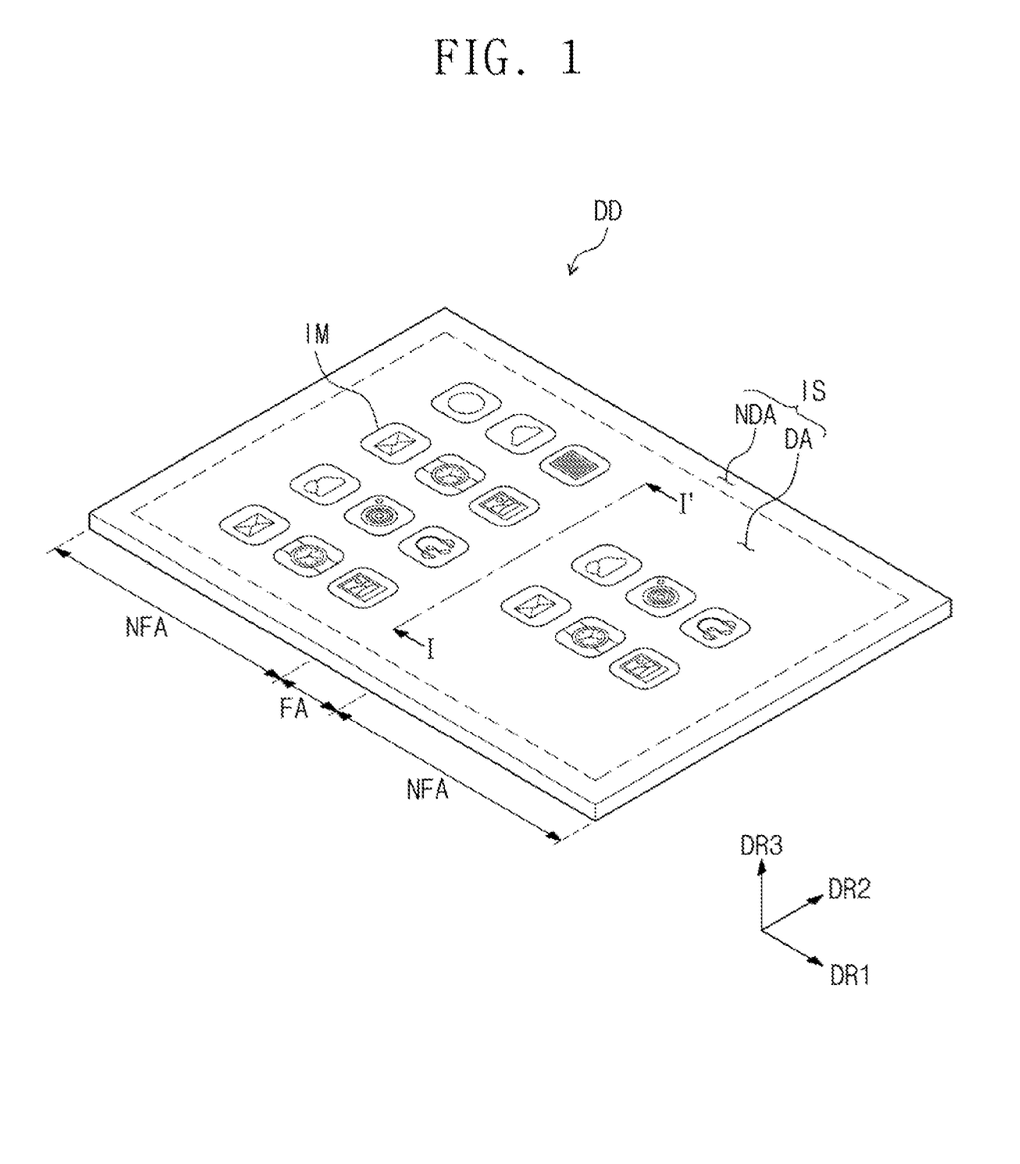
FIG. 1 is a perspective view of a display device according to an embodiment of the inventive concept.
Figure 2:
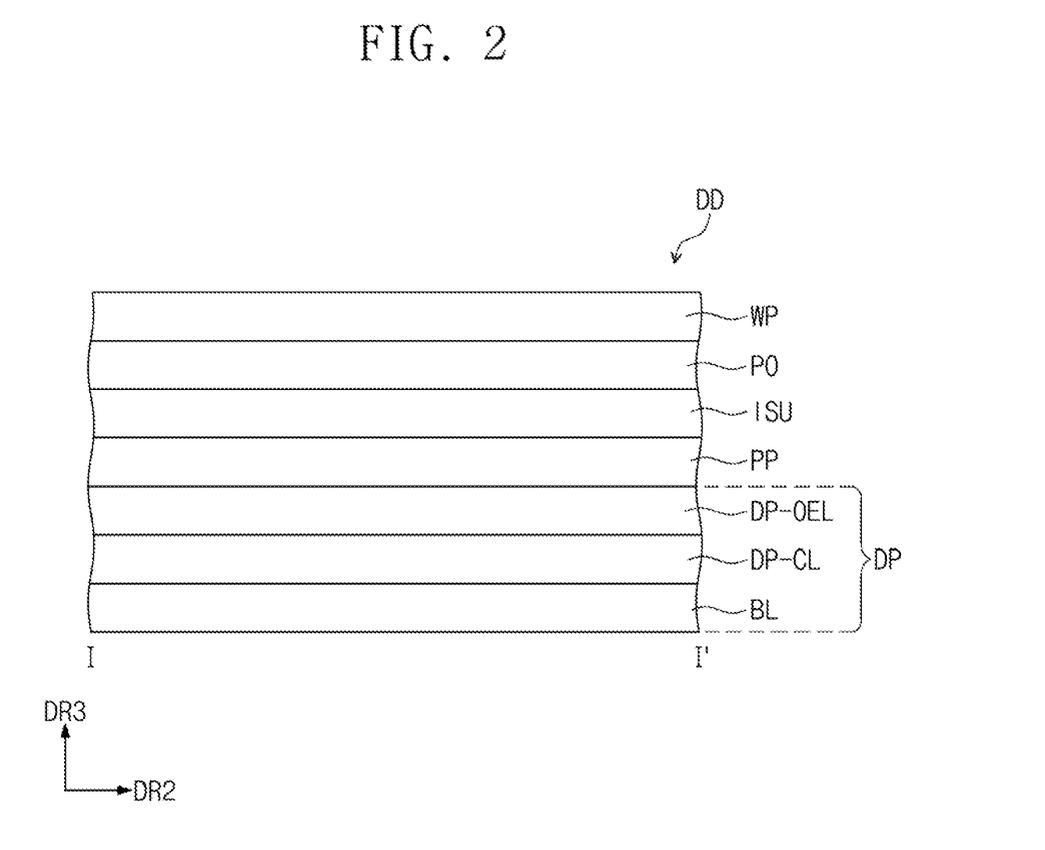
FIG. 2 is a cross-sectional view of a display device according to an embodiment of the inventive concept.

FIG. 1 is a perspective view of a display device DD according to an embodiment. FIG. 2 is a cross-sectional view of a display device DD of an embodiment, corresponding to line I-I' of FIG. 1.

Figure 3:
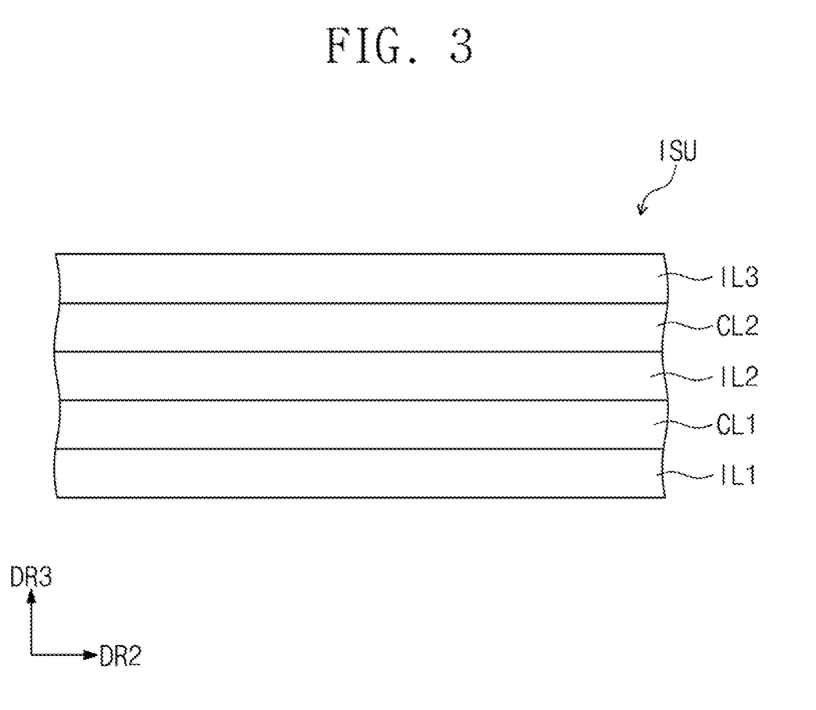
FIG. 3 is a cross-sectional view of an input sensing layer according to an embodiment of the inventive concept.
Figure 4:
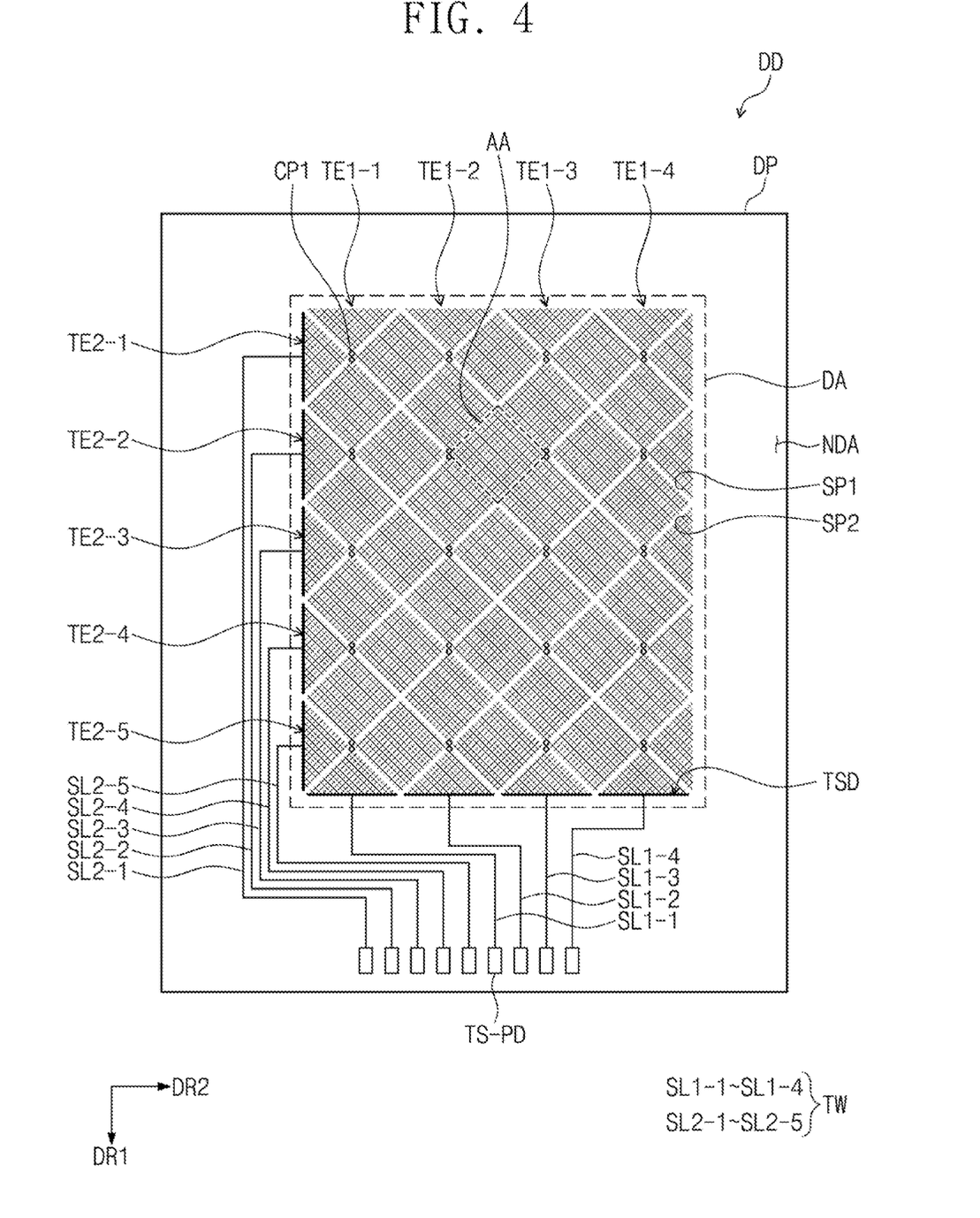
FIG. 4 is a plan view of a part of a display device according to an embodiment of the inventive concept.

FIG. 3 is a cross-sectional view of an input sensing layer ISU according to an embodiment. FIG. 4 is a plan view of an input sensing layer ISU disposed on a display panel DP according to an embodiment.

Figure 5:
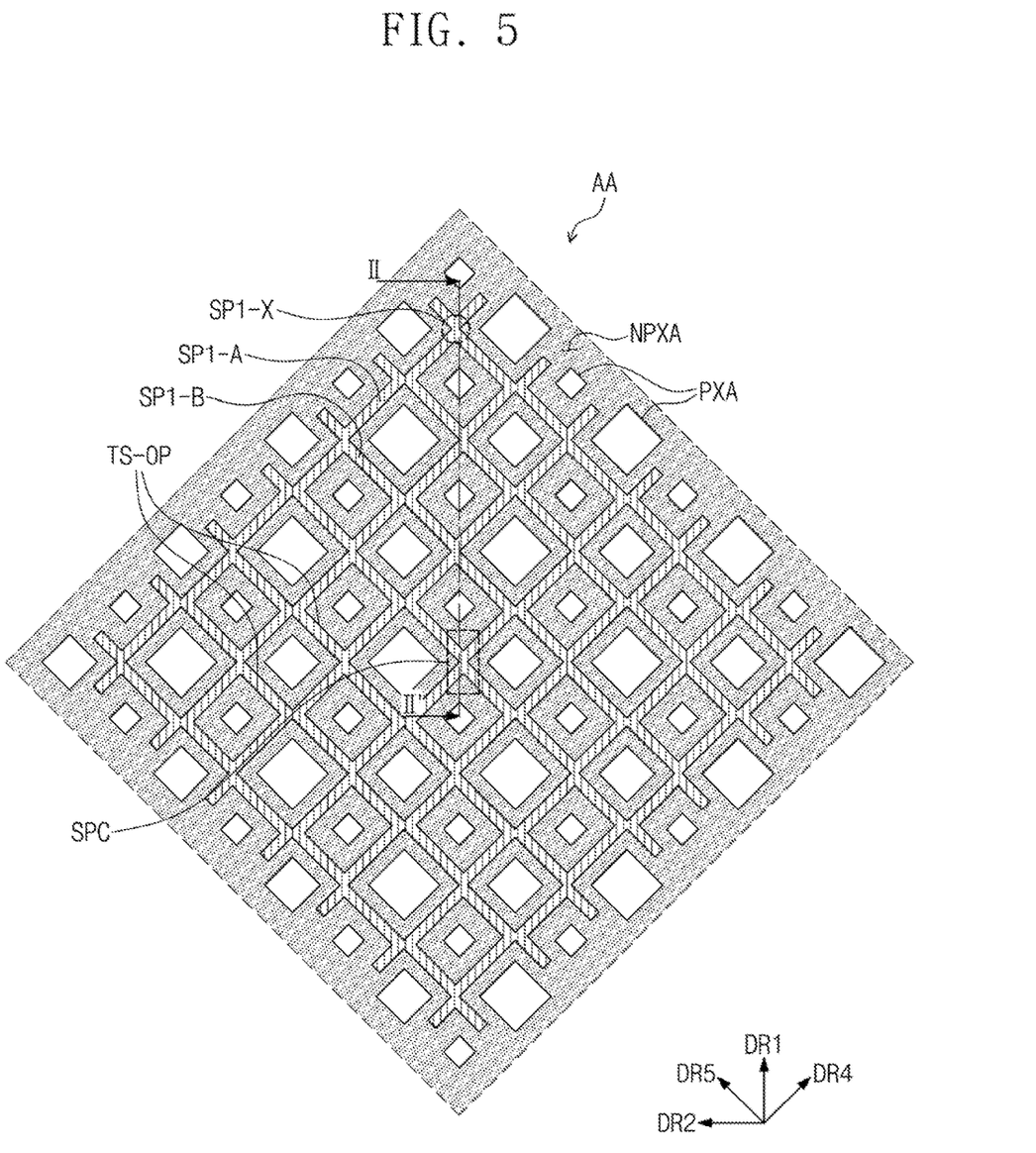
FIG. 5 is an enlarged plan view of region AA of FIG. 4.
Figure 6:
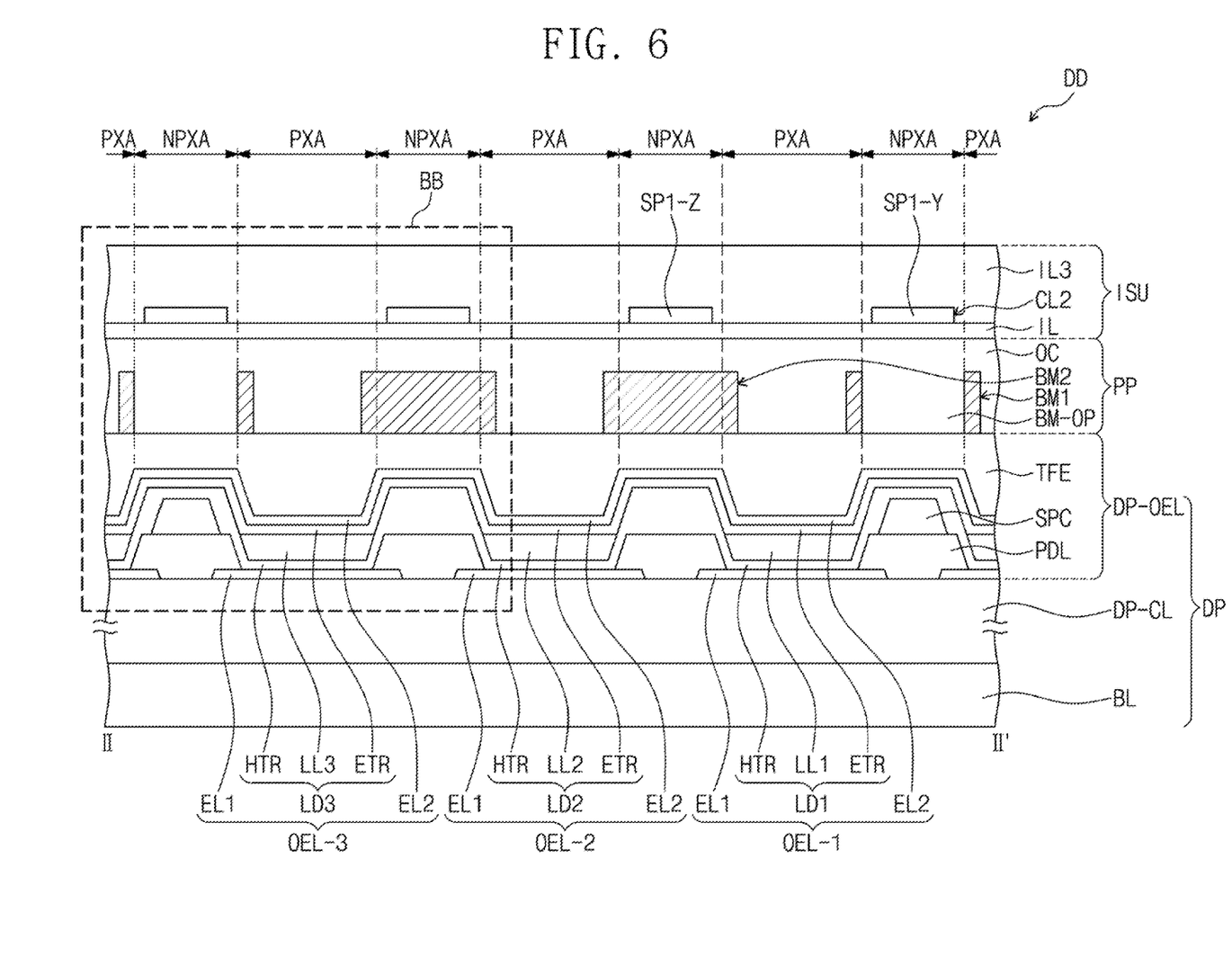
FIG. 6 is a cross-sectional view of a display device according to an embodiment of the inventive concept.

FIG. 5 is an enlarged view of region AA of FIG. 4. FIG. 6 is a cross-sectional view of a display device DD of an embodiment, corresponding to line II-II' of FIG. 5.

According to an embodiment, FIG. 1 illustrates a portable electronic device as a display device DD. The display device DD, however, may not only be used for large-sized electronic devices such as television sets, computer monitors, or outdoor billboards, but also used for small and medium-sized electronic devices such as personal computers, laptop computers, personal digital assistants, car navigation units, game consoles, smart phones, tablets, or cameras. In addition, these are merely presented as examples, and thus the display device DD can be adopted for other electronic devices without departing from an embodiment of the inventive concept.

Referring to FIG. 1, according to an embodiment, the display device DD displays an image IM through a display surface IS. The display surface IS is parallel to a plane defined by a first direction DR1 and a second direction DR2 that crosses the first direction DR1. The display surface IS includes a display area DA in which the image IM is displayed and a non-display area NDA adjacent to the display area DA. The non-display area NDA is an area where no image is displayed. The display device DD also has a foldable area FA about which the display device DD can be folded, and non-foldable areas NFA on either side of the foldable area FA.

According to an embodiment, the display area DA has a rectangular shape. The non-display area NDA surrounds the display area DA. However, embodiments of the inventive concept are not limited thereto, and in other embodiments, the shape of the display area DA and the non-display area NDA have other shapes. In addition, there may not be the non-display area NDA on a front surface of the display device DD.

Referring to FIG. 2, according to an embodiment, the display device DD includes a display panel DP. The display panel DP includes the display element layer DP-OEL, a circuit layer DP-CL, and a base substrate BL. That is, the display panel DP includes the base substrate BL, the circuit layer DP-CL disposed on the base substrate BL, and the display element layer DP-OEL disposed on the circuit layer DP-CL. The display device DD further includes a light blocking pattern layer PP disposed on the display element layer DP-OEL and an input sensing layer ISU disposed on the light blocking pattern layer PP.

According to an embodiment, the base substrate BL provides a base surface on which the display element layer DP-OEL is disposed. The base substrate BL may be a glass substrate, a metal substrate, or a plastic substrate, etc. However, embodiments are not limited thereto, and the base substrate BL may be an inorganic layer, an organic layer, or a composite material layer.

According to an embodiment, the circuit layer DP-CL is disposed on the base substrate BL, and the circuit layer DP-CL includes a plurality of transistors. The transistors each include a control electrode, an input electrode, and an output electrode. For example, the circuit layer DP-CL includes a switching transistor and a driving transistor that drive light emitting elements OEL-1, OEL-2, and OEL-3 in the display element layer DP-OEL.

According to an embodiment, the display element layer DP-OEL is disposed on the circuit layer DP-CL and includes a plurality of pixel defining films PDL spaced apart from each other, a protrusion SPC disposed on at least one of the pixel defining films PDL, a plurality of light emitting elements OEL-1, OEL-2, and OEL-3 disposed between the pixel defining films PDL, and an encapsulation layer TFE disposed on the light emitting elements OEL-1, OEL-2 and OEL-3.

According to an embodiment, the pixel defining film PDL separates the light emitting elements OEL-1, OEL-2, and OEL-3. The protrusion SPC is disposed on the pixel defining film PDL. The encapsulation layer TFE is disposed on the light emitting elements OEL-1, OEL-2, and OEL-3.

Referring to FIG. 6, according to an embodiment, each of the light emitting elements OEL-1, OEL-2, and OEL-3 may include a first electrode EL1, functional layers LD1, LD2, and LD3 disposed on the first electrode EL1, and a second electrode EL2 disposed on the functional layers LD1, LD2, and LD3. The functional layers LD1, LD2, and LD3 include a hole transport region HTR, light emitting layers LL1, LL2, and LL3 disposed on the hole transport region HTR, and an electron transport region ETR disposed on the light emitting layers LL1, LL2, and LL3.

According to an embodiment, the functional layers LD1, LD2, and LD3, such as the hole transport region HTR, the light emitting layers LL1, LL2, and LL3, and the electron transport region ETR, may be formed using one of various methods, such as a vacuum deposition method, a spin coating method, a cast method, a Langmuir-Blodgett (LB) method, an inkjet printing method, a laser printing method, or a laser induced thermal imaging (LITI) method.

According to an embodiment, FIG. 6 illustrates that the hole transport region HTR is provided as a common layer that overlaps the pixel defining film PDL but embodiments are not limited thereto, and in other embodiments, the hole transport region HTR is provided between the pixel defining films PDL. For example, the hole transport region HTR can be provided between the pixel defining films PDL using an inkjet printing method.

According to an embodiment, the pixel defining film PDL is formed of a polymer resin. For example, the pixel defining film PDL can be formed from a polyacrylate-based resin or a polyimide-based resin. In addition, the pixel defining film PDL may further include an inorganic material in addition to the polymer resin. In addition, the pixel defining film PDL may include a light absorbing material, a black pigment or a black dye. The pixel defining film PDL formed from a black pigment or a black dye forms a black pixel defining film. In forming a pixel defining film PDL, carbon black may be used as the black pigment or the black dye, but embodiments of the inventive concept are not limited thereto.

In addition, according to an embodiment, the pixel defining film PDL may be formed of an inorganic material. For example, the pixel defining film PDL may include silicon nitride ($SiN_x$), silicon oxide ($SiO_x$), or silicon oxynitride ($SiO_xN_y$), etc.

According to an embodiment, the protrusion SPC is disposed on at least one of the pixel defining films PDL.

According to an embodiment, the pixel defining films PDL define a plurality of light emitting regions PXA. The pixel defining films PDL separate the light emitting regions PXA from a non-light emitting region NPXA. According to an embodiment, the pixel defining film PDL and the protrusion SPC are disposed on the non-light emitting region NPXA. The non-light emitting region NPXA surrounds the light emitting regions PXA.

According to an embodiment, the encapsulation layer TFE covers an upper surface of the second electrode EL2.

According to an embodiment, the light blocking pattern layer PP is disposed on the display element layer DP-OEL. That is, the light blocking pattern layer PP is disposed on the encapsulation layer TFE. The light blocking pattern layer PP includes a plurality of light blocking parts BM1 and BM2 that overlap the pixel defining films PDL, and an opening BM-OP formed in the light blocking part BM1 that overlaps the protrusion SPC. The light blocking pattern layer PP will be described in detail below with respect to FIGS. 6 and 7.

Referring back to FIG. 3, according to an embodiment, the input sensing layer ISU includes a first conductive layer CL1, a second conductive layer CL2, and a plurality of insulating layers IL1, IL2, and IL3. The first conductive layer CL1 is disposed on the first insulating layer IL1, the second insulating layer IL2 is disposed on the first conductive layer CL1, the second conductive layer CL2 is disposed on the second insulating layer IL2, and the third insulating layer IL3 is disposed on the second conductive layer CL2. However, embodiments are not limited thereto and in other embodiments, the first insulating layer IL1 is a buffer layer. The first insulating layer IL1 may be omitted.

According to an embodiment, each of the first conductive layer CL1 and the second conductive layer CL2 may have a single layer structure or a multilayer structure stacked in a third direction DR3 normal to the display surface IS of the display device DD. The multilayer conductive layer includes at least two layers that include at least a transparent conductive layer and a metal layer. The multilayer conductive layer may include different metal layers. The transparent conductive layer includes at least one of indium tin oxide (ITO), indium zinc oxide (IZO), zinc oxide (ZnO), indium tin zinc oxide (ITZO), PEDOT, a metal nanowire, or graphene. The metal layer includes at one of molybdenum, silver, titanium, copper, aluminum, or alloys thereof.

According to an embodiment, each of the first conductive layer CL1 and the second conductive layer CL2 includes a plurality of patterns. Hereinafter, the first conductive layer CL1 will be described as including first pattern lines SP1-A and the second conductive layer CL2 will be described as including second pattern lines SP1-B.

According to an embodiment, each of the first insulating layer IL1 to third insulating layer IL3 may include an inorganic material or an organic material. The inorganic material includes at least one of aluminum oxide, titanium oxide, silicon oxide, silicon nitride, silicon oxynitride, zirconium oxide, or hafnium oxide. The organic material includes at least one of acrylic resin, methacrylic resin, polyisoprene, vinyl resin, epoxy resin, urethane resin, cellulose resin, siloxane resin, polyimide resin, polyamide resin, or perylene resin.

According to an embodiment, each of the first insulating layer IL1 to third insulating layer IL3 may have a single layer or a multilayer structure. Each of the first insulating layer IL1 to third insulating layer IL3 includes at least one of an inorganic layer and one of an organic layer. The inorganic layer and the organic layer are formed by chemical vapor deposition. However, the stacking structure of the input sensing layer ISU is not limited to the embodiment illustrated in FIG. 3. In other embodiments, the second insulating layer IL2 of the input sensing layer ISU is omitted.

According to an embodiment, the second insulating layer IL2 is sufficient to insulate the first conductive layer CL1 from the second conductive layer CL2, and the shape thereof is not limited. The shape of the first insulating layer IL1 varies depending on the shapes of the first pattern lines SP1-A and the second pattern lines SP1-B. The first insulating layer IL1 includes a plurality of insulating patterns.

According to an embodiment, an insulating layer IL included on the input sensing layer ISU shown in FIG. 6 may be the first insulating layer IL1 or the second insulating layer CL2. For example, the insulating layer IL is the first insulating layer IL1.

FIG. 4 is a plan view of an input sensing layer ISU disposed on the display panel DP according to an embodiment. FIG. 5 is an enlarged view of region "AA" of FIG. 4.

In the plan view of FIG. 4, according to an embodiment, the input sensing layer ISU is disposed on the display area DA and includes first sensing electrodes TE1-1 to TE1-4, first signal lines SL1-1 to SL1-4 connected to the first sensing electrodes TE1-1 to TE1-4, second sensing electrodes TE2-1 to TE2-5, and second signal lines SL2-1 to SL2-5 connected to the second sensing electrodes TE2-1 to TE2-5. In addition, connection electrodes TSD are disposed between the first sensing electrodes TE1-1 to TE1-4 and the first signal lines SL1-1 to SL1-4, and between the second signal lines SL2-1 to SL2-5 and the second sensing electrodes TE2-1 to TE2-5. The connection electrodes TSD are connected to ends of each of the first sensing electrodes TE1-1 to TE1-4 and the second sensing electrodes TE2-1 to TE2-5 to transmit signals.

In FIG. 4, according to an embodiment, the first signal lines SL1-1 to SL1-4 and the second signal lines SL2-1 to SL2-5 connect the sensing electrodes TE1-1 to TE1-4 and TE2-1 to TE2-5 with a sensing pad TS-PD and form a wiring part TW on the drawing.

According to an embodiment, the input sensing layer ISU is illustrated as including four first sensing electrodes TE1-1 to TE1-4 and five second sensing electrodes TE2-1 to TE2-5 as an example, but embodiments are not limited thereto.

Referring to FIG. 4, according to an embodiment, the first sensing electrodes TE1-1 to TE1-4 and the second sensing electrodes TE2-1 to TE2-5 have a mesh shape.

According to an embodiment, each of the first sensing electrodes TE1-1 to TE1-4 includes a first sensor part SP1, and first connection parts CP1 that each connect the first sensing electrodes TE1-1 to TE1-4. Each of the first connection parts CP1 also connects the first sensor part SP1. In addition, the first sensor part SP1 includes a first pattern line SP1-A and a second pattern line SP1-B. A touch opening TS-OP, shown in FIG. 5, is formed by the first pattern line SP1-A and the second pattern line SP1-B.

According to an embodiment, each of the second sensing electrodes TE2-1 to TE2-5 includes a second sensor part SP2.

Referring to FIGS. 4 and 5, according to an embodiment, the first sensor part SP1 overlaps the non-light emitting region NPXA. The first sensor part SP1 includes a plurality of first pattern lines SP1-A that extend in a fourth direction DR4 that crosses the first direction DR1 and the second direction DR2, and a plurality of second pattern lines SP1-B that extend in a fifth direction DR5 that crosses the fourth direction DR4. The plurality of first pattern lines SP1-A and the plurality of second pattern lines SP1-B are formed by mesh lines. The line width of the mesh lines is several microns.

According to an embodiment, the plurality of first pattern lines SP1-A and the plurality of second pattern lines SP1-B are connected to each other to form a plurality of touch openings TS-OP. In other words, the first sensor part SP1 has a mesh shape that includes a plurality of touch openings TS-OP. The touch openings TS-OP are illustrated as having a one-to-one correspondence with the light emitting regions PXA, but embodiments are not limited thereto. In other embodiments, one touch opening TS-OP corresponds to two or more light emitting regions PXA.

According to an embodiment, the protrusion SPC of FIG. 5 is illustrated as being surrounded by four light emitting regions PXA. Each light emitting regions PXA corresponds to a light emitting layer of a light emitting element.

For example, according to an embodiment, the protrusion SPC is illustrated as being surrounded by one light emitting element that emits blue light, one light emitting element that emits red light, and two light emitting elements that emit green light. However, embodiments are not limited thereto.

The first pattern line SP1-A and the second pattern line SP1-B according to an embodiment cross each other to form a plurality of intersections SP1-X. The intersections SP1-X overlap the openings BM-OP and the protrusion SPC as will be described below.

Figure 7:
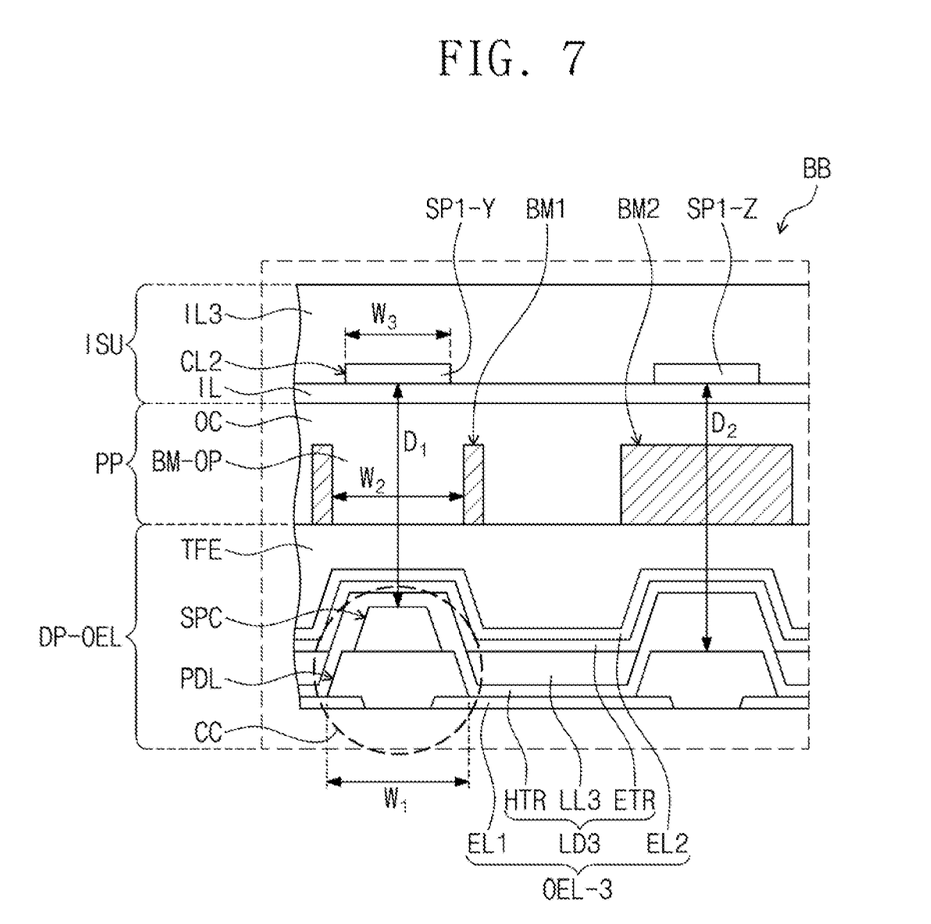
FIG. 7 is an enlarged cross-sectional view of region BB of FIG. 6.
Figure 8:
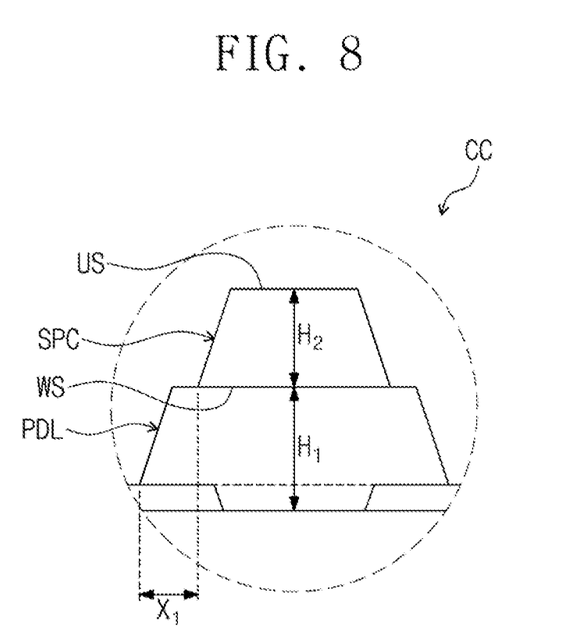
FIG. 8 is an enlarged cross-sectional view of region CC of FIG. 7.

FIG. 6 illustrates a display device DD according to an embodiment corresponding to line II-II' of FIG. 5. FIG. 7 is an enlarged view of region "BB" of FIG. 6. FIG. 8 is an enlarged view of region "CC" of FIG. 7.

Referring to FIG. 6, according to an embodiment, the display device DD includes a plurality of light emitting regions PXA spaced apart from each other and a non-light emitting region NPXA adjacent to the plurality of light emitting regions PXA. The display element layer DP-OEL includes the plurality of pixel defining films PDL that correspond to the non-light emitting region NPXA, and the plurality of light emitting elements OEL-1, OEL-2, and OEL-3 that are provided between the pixel defining films PDL. The plurality of light blocking parts BM1 and BM2 are disposed in the non-light emitting region NPXA and overlap the pixel defining film PDL, and both edges of the light blocking pans BM1 and BM2 may overlap the light emitting region PXA.

In FIG. 6, according to an embodiment, the sizes of the light emitting regions PXA are shown as being the same, but embodiments are not limited thereto, and in other embodiments, the sizes of the light emitting regions PXA varies. For example, the sizes of the light emitting regions PXA that emit blue light and the light emitting regions PXA that red light are different.

According to an embodiment, the protrusion SPC is disposed on at least one of the pixel defining films PDL. For example, the protrusion SPC is formed on at least one pixel defining film PDL.

According to an embodiment, in forming the pixel defining film PDL, the protrusion SPC is integrally formed with the pixel defining film PDL. For example, the protrusion SPC is disposed only on some of the plurality of pixel defining films PDL. The protrusion SPC are formed between two to four pixel defining films PDL that are closest to the protrusion SPC and do not include the protrusion SPC.

In an embodiment, the protrusion SPC includes a lower surface WS adjacent to the pixel defining film PDL and an upper surface US that faced the lower surface WS. The upper surface US has a polygonal shape on a plane parallel to the upper surface US. In the polygonal shape of the upper surface US, the length of one side is about 10 μm to 30 μm. That is, the protrusion SPC has a polygon shape having neighboring sides of different lengths. For example, the protrusion SPC has a square shape with two pairs of parallel sides having the same length. However, embodiments are not limited thereto.

In an embodiment, the protrusion SPC has a maximum height $H_2$ and the pixel defining film PDL has a maximum height of $H_1$. The ratio of the maximum height $H_2$ of the protrusion SPC to the maximum height $H_1$ of the pixel defining film PDL in a cross section parallel to the stacking direction of the display element layer DP-OEL satisfies Expression 1.

$$0.3 \leq H_2/H_1 \leq 1. \quad \text{Expression 1}$$

According to an embodiment, the maximum height $H_1$ of the pixel defining film PDL is about 1 μm to about 3 μm. The maximum height $H_2$ of the protrusion SPC is about 1 μm to about 2 μm. The maximum height $H_1$ of the pixel defining film PDL is greater than or equal to the maximum height $H_2$ of the protrusion SPC. In Expression 1, the values of $H_1/H_2$ may be close to one.

According an embodiment, an area ratio of the protrusion SPC with respect to a total area of the light emitting regions PXA is about 1% to about 2%. That is, when the total area of the light emitting regions PXA is 100/0, the protrusion SPC has an area ratio of about 1% to about 2%. In practice, the area ratio is close to 1.49%.

Referring to FIGS. 6 and 7, according to an embodiment, the light blocking pattern layer PP includes a first light blocking part BM1, a second light blocking part BM2, and an organic layer OC.

According to an embodiment, the light blocking parts BM1 and BM2 include a light blocking material. For example, the second light blocking part BM2 includes a metal or metal oxide such as black dye, black pigment, carbon black, or chromium, etc. However, the color of the light blocking parts BM1 and BM2 is not limited to black, and in other embodiments, pigments or dyes of other colors having a light blocking characteristic can be used without limitation.

According to an embodiment, the first light blocking part BM1 has an opening BM-OP that overlaps the protrusion SPC. The second light blocking part BM2 does not overlap the protrusion SPC but overlaps other pixel defining films PDL. The organic layer OC is disposed on the light blocking parts BM1 and BM2 and fills the opening BM-OP.

The input sensing layer ISU according to an embodiment include a first intersection SP1-Y and a second intersection SP1-Z.

According to an embodiment, the first intersection SP1-Y overlaps the protrusion SPC and the opening BM-OP formed in the first light blocking part BM1. That is, the first intersection SP1-Y, the protrusion SPC, and the opening BM-OP overlap.

According to an embodiment, the second intersection SP1-Z does not overlap the protrusion SPC but overlaps the pixel defining films PDL. In addition, the second intersection SP1-Z overlaps the second light blocking part BM2. That is, the second intersection SP1-Z overlaps the pixel defining film PDL and the second light blocking part BM2.

According to an embodiment, the ratio of a shortest distance $D_1$ between the protrusion SPC and the first intersection SP1-Y to a shortest distance $D_2$ between the pixel defining film PDL and the second intersection SP1-Z satisfies Expression 2 below.

$$0.8 \leq D_1/D_2 < 1. \quad \text{Expression 2}$$

That is, according to an embodiment, the shortest distance $D_1$ between the protrusion SPC and the first intersection SP1-Y has a value less than the shortest distance $D_2$ between the pixel defining film PDL and the second intersection SP1-Z. For example, the values of $D_1/D_2$ are close to 0.8.

Referring to FIG. 7, according to an embodiment, in a cross section parallel to the stacking direction of the display element layer DP-OEL, the pixel defining film PDL has a maximum width that is a first $W_1$, and the opening BM-OP that overlaps the pixel defining film PDL has a second width $W_2$. The value of the first width $W_1$ of the pixel defining film PDL is the same as the value of the second width $W_2$ of the opening BM-OP. That is, the first width $W_1$ and the second width $W_2$ are equal.

According to an embodiment, the first intersection SP1-Y has a third width $W_3$. The third width $W_3$ of the first intersection SP1-Y differs from the first width $W_1$ and the second width $W_2$. The third width $W_3$ of the first intersection SP1-Y has a value less than the first width $W_1$ and the second width $W_2$.

According to an embodiment, the pixel defining film PDL has an exposure width $X_1$ of one side of that does not overlap the protrusion SPC. The exposure width $X_1$ is about 7 μm to about 8 μm. For example, the exposure width $X_1$ is close to 7 μm.

According to an embodiment, the opening BM-OP is formed by removing a portion of the first light blocking part BM1 that overlaps the protrusion SPC. By having the first intersection SP1-Y, the opening BM-OP, and the protrusion SPC overlap each other, a thickness difference between the region where the protrusion SPC is formed and the region where the protrusion SPC is not formed is reduced. Accordingly, a dielectric constant difference between the area where the first intersection SP1-Y, the opening BM-OP, and the protrusion SPC overlap is reduced, thereby providing a display device having increased sensitivity.

Figure 9:
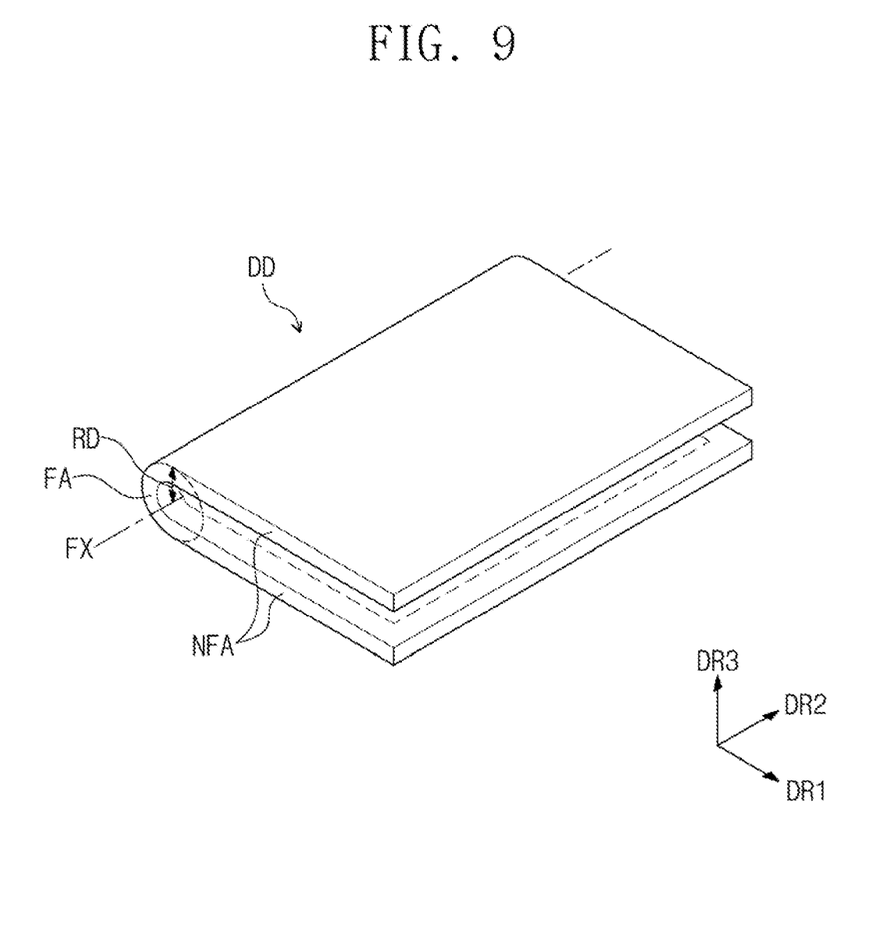
FIG. 9 is a perspective view of a display device according to an embodiment of the inventive concept.

FIG. 9 exemplarily illustrates folding a display device DD illustrated in FIG. 1, according to an embodiment of the inventive concept. Referring to FIG. 9, the display device DD is illustrated as being in-folded along one folding axis FX, but embodiments are not limited thereto, and in other embodiments, unlike that illustrated, the display device DD can be out-folded along the one folding axis FX. That is, the display device DD is capable of being both in-folded and out-folded along the one folding axis FX. The foldable area FA of the display device is the area of the display device that curves about the one folding axis FX. The non-foldable areas do not fold, but remain flat.

In a present specification, in-folding means that the display area DA is folded to face each other, and out-folding means that the display area DA is folded not to face each other.

Referring to FIG. 9, according to an embodiment, when the display device DD is folded along the one folding axis FX, a radius of curvature RD is about 1 mm to about 5 mm with respect to a folding axis FX.

Referring back to FIG. 2, the display device DD according to an embodiment further includes a polarization layer PO disposed on the input sensing layer ISU and a window layer WP disposed on the polarization layer PO.

In addition, according to an embodiment, a color filter layer is included instead of the polarization layer PO.

According to an embodiment, the polarization layer PO blocks external light incident to the display panel DP from outside of the display device DD. The polarization layer PO blocks some of the external light.

According to an embodiment, the polarization layer PO includes a linear polarizer. The linear polarizer linearly polarizes the incident light in one direction. The linear polarizer is a film-type polarizer that includes an elongated polymer film. For example, the elongated polymer film is an elongated polyvinylalcohol-based film. In addition, the linear polarizer may be a coating-type polarizing layer.

According to an embodiment, the color filter layer includes a plurality of color filters and an organic layer that protects the color filters. The color filters are spaced apart from each other on a plane. A light blocking layer is disposed between the color filters spaced apart from each other, and the light blocking layer prevents light leakage and separates the boundary between adjacent color filters.

According to an embodiment, the organic film disposed on the color filters is transparent. The organic film is formed of a polymer resin.

According to an embodiment, the window layer WP includes a glass substrate or a polymer resin substrate. For example, the window layer WP includes a tempered glass substrate. In addition, the window layer WP may be a polymer resin substrate and that includes a polyimide resin, etc. The window layer WP exhibits high transmittance to transmit images received from the display panel DP as they are and protects the display panel DP from external impacts.

According to an embodiment, a difference in dielectric constant in the light blocking pattern layer is reduced by removing a portion that overlaps the protrusion on the pixel defining film in the light blocking part of the light blocking pattern layer, and thus the sensitivity of the input sensing layer is increased.

A display device according to an embodiment provides improved touch sensitivity by removing some of a light blocking part that overlaps a protrusion formed on the pixel defining film.

Although embodiments of the inventive concept have been described with reference to exemplary embodiments of the inventive concept, it will be understood that embodiments of the inventive concept should not be limited to exemplary embodiments but various changes and modifications can be made by those skilled in the art without departing from the spirit and scope of embodiments of the inventive concept.

Accordingly, the technical scope of embodiments of the inventive concept is not intended to be limited to exemplary embodiments set forth in the detailed description of the specification, but is intended to be defined by the appended claims.

What is claimed is:

1. A display device, comprising:
   a circuit layer;
   a display element layer disposed on the circuit layer;
   a light blocking pattern layer disposed on the display element layer; and
   an input sensing layer disposed on the light blocking pattern layer and that includes a plurality of sensing electrodes,
   wherein the display element layer comprises:
      a plurality of pixel defining films spaced apart from each other;
      a protrusion disposed on at least one of the plurality of pixel defining films;
      light emitting elements provided between the pixel defining films; and
      an encapsulation layer disposed on the light emitting elements,
   wherein the light blocking pattern layer comprises:
      a plurality of light blocking parts that overlap the pixel defining films, and
      an opening formed in at least one of the plurality of light blocking parts that overlaps the protrusion,
   wherein each of the sensing electrodes comprises:
      a first pattern line that extends in a first direction;
      a second pattern line that extends in a second direction that crosses the first direction; and
      an intersection where the first pattern line and the second pattern line cross each other,
   wherein the protrusion, the opening, and the intersection overlap, and
   wherein in a cross section parallel to a stacking direction of the display element layer and the light blocking pattern layer, a ratio of a maximum height $H_2$ of the protrusion to a maximum height $H_1$ of the at least one of the plurality of pixel defining films satisfies a following expression:

$$0.3 \leq H_2/H_1 \leq 1.$$

2. The display device of claim 1, wherein in a cross-section parallel to a stacking direction of the display element layer and the light blocking pattern layer, a first width that is a maximum width of one of the pixel defining films is equal to a second width of the opening.

3. The display device of claim 2, wherein in the cross section, a third width of the intersection is less than the first width and the second width.

4. The display device of claim 1, wherein the light blocking pattern layer is directly disposed on the display element layer, and
   the input sensing layer is directly disposed on the light blocking pattern layer.

5. The display device of claim 1, wherein an exposure width of one side of the at least one of the plurality of pixel defining films on which the protrusion is disposed and which does not overlap the protrusion is about 7 μm to about 8 μm.

6. The display device of claim 1, wherein each of the sensing electrodes comprises:
   a first intersection that overlaps the protrusion; and
   a second intersection that overlaps one of the pixel defining films but not the protrusion.

7. The display device of claim 6, wherein a ratio of a shortest distance $D_1$ between the protrusion and the first intersection to a shortest distance $D_2$ between the one of the pixel defining films and the second intersection satisfies a following expression:

$$0.8 \leq D_1/D_2 < 1.$$

8. The display device of claim 6, wherein each of the sensing electrodes comprises a plurality of the first intersections and a plurality of the second intersections disposed adjacent to each other in one direction, and
   two to four of the plurality of second intersections are disposed between closest first intersections.

9. The display device of claim 1, comprising a display area and a non-display area that surrounds the display area, wherein on a plane, an area ratio of the protrusion with respect to a total area of the display area is about 1% to about 2%.

10. A display device, comprising:
    a display element layer;
    a light blocking pattern layer disposed on the display element layer; and
    an input sensing layer disposed on the light blocking pattern layer and that includes a plurality of sensing electrodes,
    wherein the display element layer comprises:
       a plurality of pixel defining films spaced apart from each other;
       a protrusion disposed on at least one of the plurality of pixel defining films;
       light emitting elements provided between the pixel defining films; and an encapsulation layer disposed on the light emitting elements, wherein the light blocking pattern layer comprises:
a plurality of light blocking parts that overlap the pixel defining films, and
an opening formed in at least one of the plurality of light blocking arts that overlaps the protrusion, wherein each of the sensing electrodes comprises:
a first pattern line that extends in a first direction;
a second pattern line that extends in a second direction that crosses the first direction; and
an intersection where the first pattern line and the second pattern line cross each other, wherein the protrusion, the opening, and the intersection overlap, and wherein the protrusion comprises: a lower surface adjacent to the at least one of the plurality of pixel defining films; and
an upper surface that faces the lower surface, and
in a plane parallel to the upper surface, the upper surface has a polygonal shape that has one side length of about 10 μm to about 30 μm.

11. The display device of claim 1, wherein each of the light emitting elements comprises a first electrode and a second electrode that face each other, and a light emitting layer disposed between the first electrode and the second electrode.

12. The display device of claim 1, further comprising a polarization layer disposed on the input sensing layer.

13. A display device, comprising:
a plurality of light emitting regions and non-light emitting regions adjacent to the light emitting regions;
a display element layer that comprises a plurality of pixel defining films that correspond to the non-light emitting regions, a light emitting layer provided between the pixel defining films, and a plurality of protrusions that correspond to the non-light emitting regions;
a light blocking pattern layer disposed on the display element layer and that comprises a plurality of light blocking parts that overlap the non-light emitting regions; and
an input sensing layer disposed on the light blocking pattern layer and that includes a plurality of sensing electrodes, wherein the light blocking pattern layer comprises:
a first light blocking part that overlaps one of the protrusions and in which an opening is formed, wherein each of the sensing electrodes comprises:
a first pattern line extending in a first direction;
a second pattern line extending in a second direction crossing the first direction; and
an intersection where the first pattern line and the second pattern line cross each other, and wherein one of the protrusions, the opening, and the intersection overlap, and
two to four of the plurality of pixel defining films that do not overlap the protrusions are disposed between two most adjacent protrusions.

14. The display device of claim 13, wherein the light blocking pattern layer further comprises a second light blocking part that does not overlap the protrusion, and each of the first light blocking part and the second light blocking part overlap one of the pixel defining films.

15. The display device of claim 13, further comprising an organic layer disposed on the light blocking pattern layer and that fills spaces between the light blocking parts and the opening in the first light blocking part.

16. The display device of claim 13, wherein an area ratio of the protrusions with respect to a total area of the plurality of light emitting regions is about 1% to about 2%.

17. The display device of claim 13, further comprising a circuit layer and a base substrate disposed on a lower portion of the display element layer.

18. The display device of claim 13, wherein in a cross section parallel to a stacking direction of the display element layer and the light blocking pattern layer, a first width that is a maximum width of one of the pixel defining films is equal to a second width of the opening, and
a third width of the intersection is less than the first width and the second width.

* * * * *